United States Patent
McNeil et al.

(10) Patent No.: US 7,724,030 B1
(45) Date of Patent: May 25, 2010

(54) METHOD AND APPARATUS FOR PROVIDING A FEEDBACK PATH FOR AN OUTPUT SIGNAL

(75) Inventors: Steven E. McNeil, Rio Rancho, NM (US); Andrew W. Lai, Fremont, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 11/999,191

(22) Filed: Dec. 3, 2007

(51) Int. Cl.
*H03K 19/177* (2006.01)
*G06F 15/00* (2006.01)

(52) U.S. Cl. .............................. 326/40; 326/38; 326/39; 712/200; 712/201

(58) Field of Classification Search ............. 326/38–41; 712/200, 201, 203
See application file for complete search history.

(56) References Cited

U.S. PATENT DOCUMENTS

| | | | |
|---|---|---|---|
| 6,208,162 B1 * | 3/2001 | Bocchino | 326/38 |
| 6,686,769 B1 * | 2/2004 | Nguyen et al. | 326/46 |
| 6,867,615 B1 * | 3/2005 | Plants et al. | 326/40 |
| 6,930,509 B2 * | 8/2005 | Banik | 326/38 |

OTHER PUBLICATIONS

U.S. Appl. No. 12/417,448, filed Apr. 2, 2009, Sundararajarao Mohan, Xilinx, Inc. 2100 Logic Drive, San Jose, California 95124.

* cited by examiner

*Primary Examiner*—Vibol Tan
(74) *Attorney, Agent, or Firm*—Kin-Wah Tong

(57) ABSTRACT

In one embodiment, an integrated device is disclosed. For example, in one embodiment of the present invention, a device comprises a core module for providing one or more output signals. The device comprises an output logic module for receiving the one or more output signals and an input logic module, wherein the one or more output signals are received by the input logic module via one or more feedback paths, where the one or more output signals are forwarded back to the core module.

18 Claims, 3 Drawing Sheets

METHOD AND APPARATUS FOR PROVIDING A FEEDBACK PATH FOR AN OUTPUT SIGNAL

FIELD OF THE INVENTION

One or more aspects of the present invention relate generally to an integrated circuit (IC) and, in particular, to providing one or more feedback paths for one or more output signals.

BACKGROUND OF THE INVENTION

A programmable logic device (PLD) is a general-purpose integrated circuit (IC) that can be programmed by a user to implement a variety of selected functions. One type of PLD is a Field Programmable Gate Array (FPGA), which typically includes an array of configurable logic blocks (CLBs) and a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data to implement a user design in the FPGA. An FPGA may also include other programmable and non-programmable resources.

Testing of a PLD is often performed to ensure that it is functioning properly and that it is operating within the designed parameters. Testing of the PLD at the wafer level is advantageous in that discovery of any defects at an early stage is beneficial to a manufacturer. However, given that some of the IOB pads may not be bonded to a physical pin, e.g., at the wafer level, the testing of the PLD pertaining to these IOB pads is problematic.

SUMMARY OF THE INVENTION

In one embodiment, an integrated device is disclosed. For example, in one embodiment of the present invention, a device comprises a core module of an integrated circuit for providing one or more output signals. The device comprises an output logic module for receiving the one or more output signals, and an input logic module, wherein the one or more output signals are also received by the input logic module via one or more feedback paths, where the one or more output signals are forwarded back to the core module.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
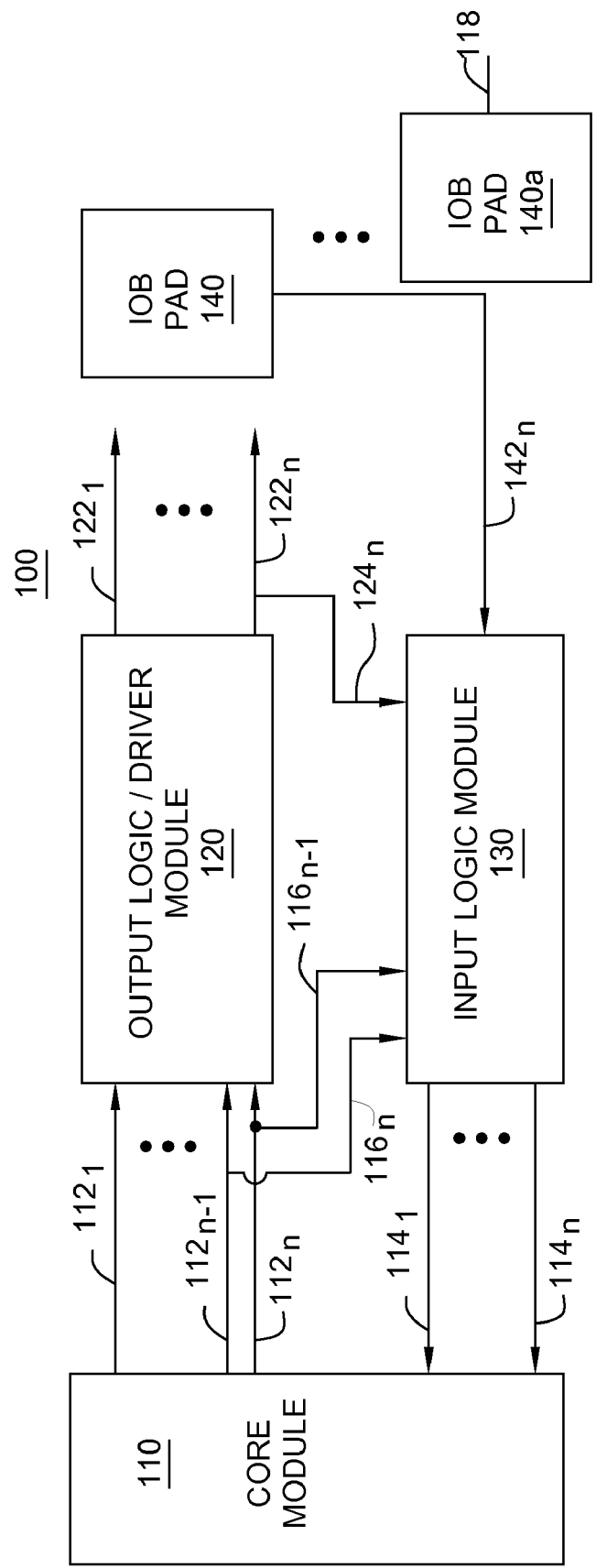
FIG. 1 illustrates an illustrative overview of a PLD of the present invention.

FIG. 1 illustrates an illustrative overview of an integrated circuit or device, e.g., a programmable logic device (PLD) 100 of the present invention. For example, the programmable logic device may comprise an FPGA in accordance with one or more embodiments of the present invention. Although the present invention is disclosed in greater details below in the context of an FPGA, the present invention is not so limited. For example, the present invention can be adapted to any programmable logic devices such as complex PLDs, as well as to other IC devices such as application-specific integrated circuit (ASIC) devices, microprocessors, and the like. In general, embodiments of the present invention may be used for testing outputs of any integrated circuit.

In one embodiment, the PLD 100 comprises a core or fabric (or broadly a core module) 110, an output logic/driver module (or broadly an output logic module) 120, an input logic module 130, and one or more IOB pads 140. Although only one output logic/driver module 120, one input logic module 130, and one IOB pad 140 are shown in FIG. 1, those skilled in the art will realize that the present invention is not so limited. For example, one or more of these modules can be deployed in accordance with implementation specific requirements.

In one embodiment, the core module 110 broadly covers the programmable logic portion of the PLD, e.g., the center of the die comprising the CLBs, IOBs and the various interconnect structures. In operation, the core module 110 is able to provide a plurality of output signals via paths $112_{1-n}$ to the output logic/driver module 120. One or more of these output signals are then presented via paths $122_{1-n}$ to one or more IOB pads 140. In one embodiment, the generated output signals are provided in response to pertinent input signals that are sent to the core module 110 via the input logic module 130.

As discussed above, a testing method can be employed to test the performance (e.g., programmed functions, signal timing, and the like) of the PLD 100, e.g., testing the core module 110 and its support circuits by sending appropriate input signals to the core module and then measuring the pertinent output signals at the appropriate IOB pads. Unfortunately, not all IOB pads 140 are bonded to physical pins, e.g., at the wafer level, such that the pertinent output signals can be detected and measured. This creates a problem where various sites on the PLD may not be readily tested at the wafer level.

In one embodiment of the present invention, one or more feedback or return paths $116_{1-n}$ are provided such that the output signals provided to the output logic/driver module 120 are also provided to the input logic module 130. In some embodiments there may be other circuit components or modules that are deployed between the core module 110 and the output logic/driver module 120, e.g., various buffers and the like, that are not shown in FIG. 1. In one embodiment, the one or more feedback or return paths $116_{1-n}$ are deployed immediately before the output logic/driver module 120 (e.g., connected to an input path of the output logic/driver module 120). In other words, the output signals provided on the feedback or return paths $116_{1-n}$ to the input logic module are output signals that have been extracted just prior to entry to the output logic/driver module 120.

In one embodiment of the present invention, the output signals received by the input logic module 130 are then returned back to the core module 110 via paths $114_{1-n}$. This unique approach provides an important advantage in the testing of the PLD 100. Specifically, if the IOB pad 140 is not yet bonded to a physical pin, then it is problematic in determining whether the proper output signals can be provided to the IOB pad 140. For example, the IOB pad 140 may be bonded to a physical pin in the future depending on the packaging of the PLD 100. Thus, testing of various portions of the PLD 100 may have to wait until a later time. In fact, in some scenarios it is possible that some IOB pads may never be bonded to a physical pin at all. For instance, in various package configurations, certain IOB pads are not bonded to a physical pin since the package does not support the given IOB. Thus, without the present invention, one or more portions of the PLD 100 may not be fully tested at the wafer level.

In one embodiment of the present invention, the output signals are returned to the core module 110 and then redirected to another IOB pad 140a, e.g., to a bonded IOB pad. Specifically, if the output signals associated with a particular IOB pad cannot be accessed for testing purposes (e.g., where the IOB pad is not bonded to a pin), then the output signals can be returned to the core module 110 where the output signals are then channeled to another IOB pad 140a that is bonded to a pin 118. This redirection of output signals allows a testing method, e.g., a testing software or routine, to properly test the entire PLD 100 at the wafer level where many of the IOB pads may have yet to be bonded to a physical pin. The testing method or software may provide the proper test inputs to the core module 110 so that the corresponding output signals are generated and forwarded to the proper IOB pads, even if the pertinent IOB pads are not bonded. Since the generated output signals are also redirected into the input logic module 130, the testing method can then redirect the generated output signals to an IOB pad that is currently bonded to measure the generated output signals. Thus, by deploying the feedback or return paths $116_{1-n}$ to the input logic module, a testing method may fully test a PLD 100 at a wafer level.

In one alternate embodiment, additional feedback or return paths can be deployed. For example, one or more feedback or return paths $124_{1-n}$, can be deployed immediately after the output logic/driver module 120 (e.g., connected to an output path of the output logic/driver module 120). For example, the output signals immediately exiting the output logic/driver module 120 can be redirected to the input logic module 130. In some embodiments one or more circuit modules or components (not shown), e.g., buffers and the like, may also be deployed between the output logic/driver module 120 and the one or more IOB pads 140. In yet another alternate embodiment, one or more feedback or return paths $142_{1-n}$ can be deployed immediately after the one or more IOB pads 140 (e.g., connected to an output path of the IOB pad 140). These additional feedback or return paths can be deployed to further assist in the testing of the PLD 100.

For example, if feedback or return paths 116, 124 and 142 are all employed, then in one embodiment, it is possible to actually determine the timing of the output signals as they traverse from the core module 110 and arrive at the IOB pad. More specifically, the testing method is able to determine the time it takes an output signal to arrive at the output logic/driver module 120 from the core module by analyzing the output signals received via feedback or return paths 116. This allows the testing method to determine the delay that can be attributed to this portion or area of the PLD 100. Similarly, the testing method is able to determine the time it takes an output signal to traverse through the output logic/driver module 120 by analyzing the output signals received via feedback or return paths 124. Finally, the testing method is also able to determine the time it takes an output signal to arrive at the IOB pad 140 from the output logic/driver module 120 by analyzing the output signals received via feedback or return paths 142.

PLD 100 in FIG. 1 is illustrated in a simplified view to assist in the understanding of the present invention. PLD 100 may contain other modules that are not illustrated in FIG. 1 but are well known to those skilled in the art.

In one embodiment of the present invention, the output signals from the core module 110 include, but are not limited to, a 3-state control signal, an output data signal, and the like. For example, the 3-state control signal is an output control signal that is provided to control the output logic/driver module so that either a particular output data is placed into the IOB pad 140 or the IOB is tri-stated or disabled. The output data signal is the actual output data, e.g., a logical one or a logical zero.

Figure 2:
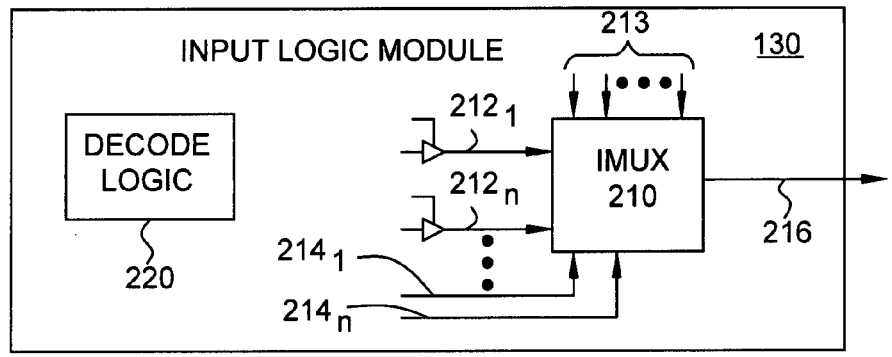
FIG. 2 illustrates an illustrative overview of an input logic module of the present invention.

FIG. 2 illustrates an illustrative overview of an input logic module 130 of the present invention. In one embodiment, the input logic module 130 comprises an input multiplexer (IMUX) 210 and a decode logic module 220. The input logic module 130 in FIG. 2 is illustrated in a simplified view to assist in the understanding of the present invention. In some embodiments the input logic module 130 may contain other modules that are not illustrated in FIG. 2 but are well known to those skilled in the art.

In one embodiment, input logic module 130 uses the input multiplexer (IMUX) 210 for receiving a plurality of input signals. For example, a user may provide a plurality of input signals via paths $212_{1-n}$. The selection of the pertinent input signal by the IMUX 210 to be passed to an output path 216 is performed via a plurality of select lines 213. The select lines are in turn controlled by the decode logic module 220. In accordance with the present invention, one or more feedback or return paths $214_{1-n}$, are also provided to the IMUX 210. For example, feedback or return paths $214_{1-n}$, may comprise one or more of the feedback or return paths 116, 124 and 142 as discussed above in FIG. 1.

Figure 3:
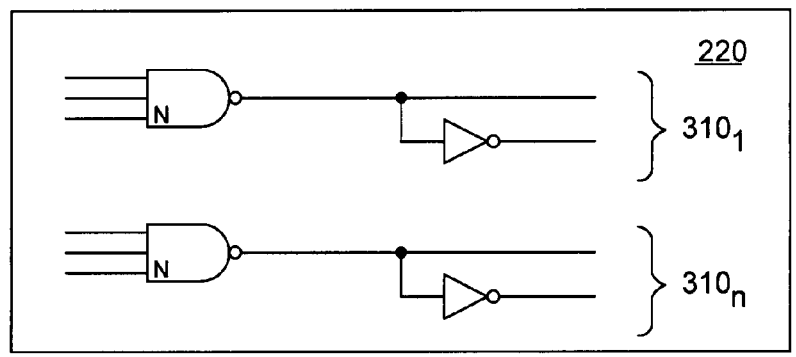
FIG. 3 illustrates an illustrative overview of a decode logic module of the present invention.

FIG. 3 illustrates an illustrative overview of a decode logic module 220 of the present invention. The decode logic module 220 comprises a plurality of decode logic portions $310_{1-n}$, where each decode logic portion is used to control access to one of the input paths feeding into the IMUX 210. The implementation of the decode logic module 220 as illustrated in FIG. 3 is only an example. Those skilled in the art will realize that different types of logic elements can be deployed to implement the functions of the decode logic module 220 in controlling the operation of the IMUX 210.

Figure 4:
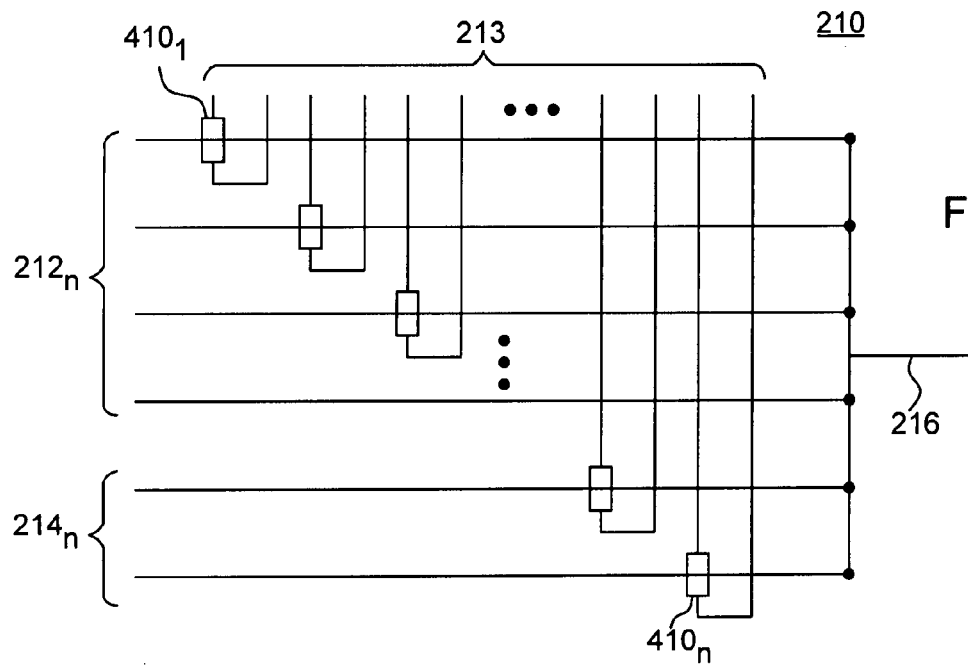
FIG. 4 illustrates an illustrative overview of an input multiplexer of the present invention.

FIG. 4 illustrates an illustrative overview of an input multiplexer 210 of the present invention. The input multiplexer 210 employs a plurality of pass gates $410_{1-n}$ which are controlled by select lines 213. As discussed above, the signals on the select lines are provided by the decode logic 220 for selecting one or more of the input signals to be passed to the output path 216. In one embodiment, one or more output paths 216 provide input signals to the core module 110. The implementation of the IMUX 210 as illustrated in FIG. 4 is only an example. Those skilled in the art will realize that different types of logic elements can be deployed to implement the functions of the IMUX 210.

Figure 5:
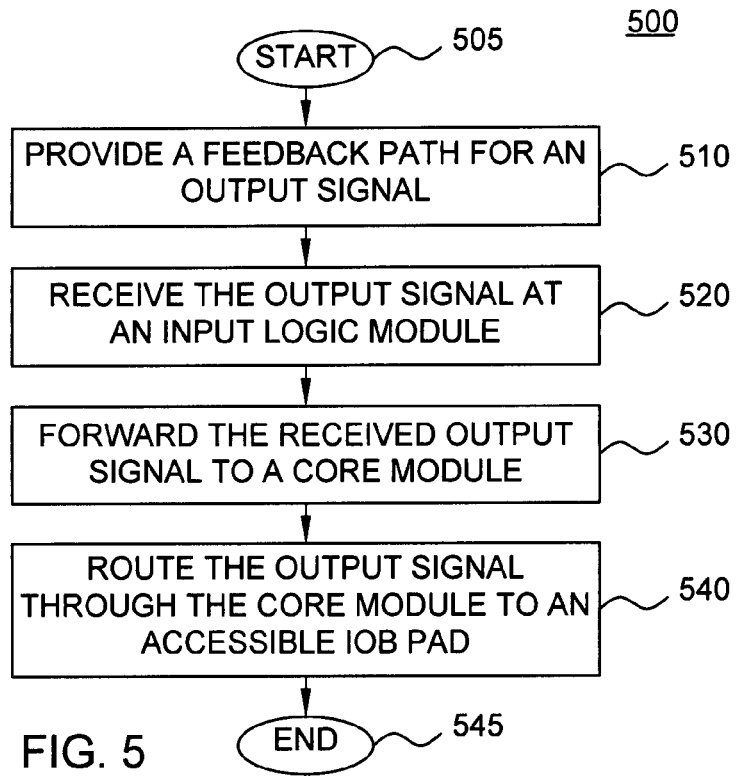
FIG. 5 illustrates a flow chart of a method for providing a feedback path to an output signal in accordance with one or more embodiments of the present invention.

FIG. 5 illustrates a flow chart of a method 500 for providing a feedback path to an output signal in accordance with one or more embodiments of the present invention. Method 500 starts in step 505 and proceeds to step 510. In step 510, one or more feedback or return paths are provided for an output signal received from a core module of a PLD. For example, one or more of the feedback or return paths 116, 124 and 142 as discussed above in FIG. 1 can be implemented for an output signal. For example, the output signal may comprise a 3-state control signal, or an output data signal.

In step 520, one or more output signals are received by an input logic module via the one or more of the feedback or return paths. For example, a 3-state control signal, and/or an output data signal directed to an output logic/driver module can be provided to the input logic module.

In step 530, the one or more output signals are forwarded back to the core module of the PLD. For example, the 3-state control signal, and/or the output data signal received by the input logic module are returned back to the core module of the PLD.

In step 540, the one or more output signals are rerouted through the core module to an accessible IOB pad. For example, the one or more output signals are rerouted through the core module to an IOB pad that is bonded to a pin such that the output signals can be detected and measured. Method 500 then ends in step 545.

Although not specifically specified, one or more steps of method 500 may include a storing, displaying and/or outputting step as required for a particular application. In other words, any data, records, fields, and/or intermediate results discussed in the method can be stored, displayed and/or outputted to another device as required for a particular application. Furthermore, steps or blocks in FIG. 5 that recite a determining operation or involve a decision, do not necessarily require that both branches of the determining operation be practiced. In other words, one of the branches of the determining operation can be deemed as an optional step.

Figure 6:
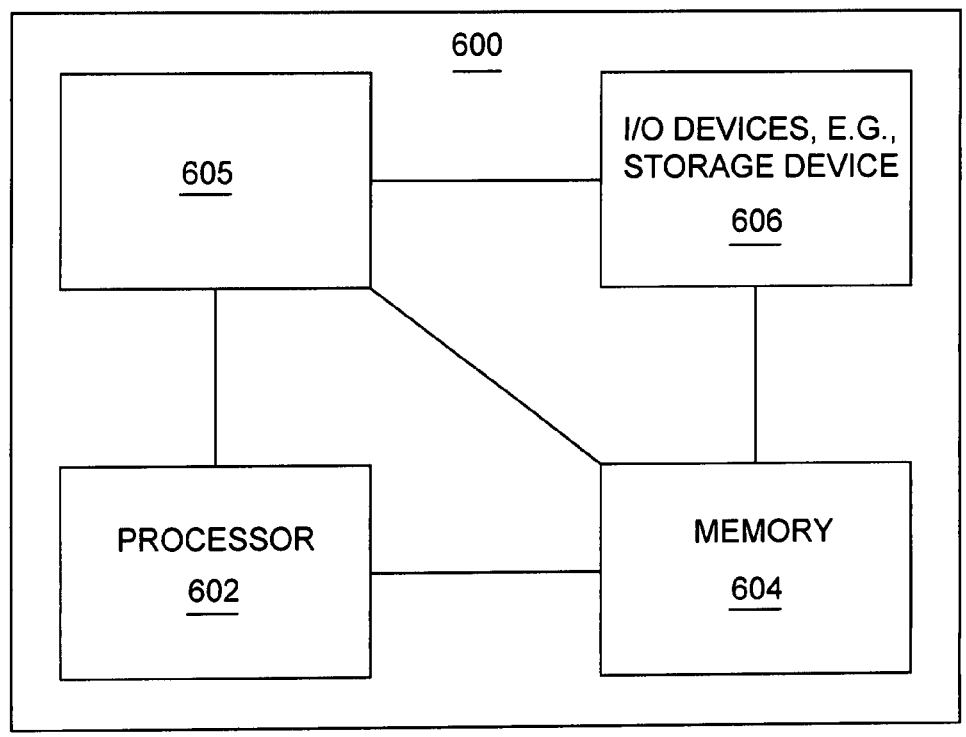
FIG. 6 illustrates a high level block diagram of a general purpose computer or a computing device suitable for use in performing the functions described herein.

FIG. 6 depicts a high level block diagram of a general purpose computer or a computing device suitable for use in performing some or all of the functions described herein. As depicted in FIG. 6, the system 600 comprises a processor element 602 (e.g., a CPU), a memory 604, e.g., random access memory (RAM) and/or read only memory (ROM), a module 605 for providing a feedback path to an output signal, and various input/output devices 606 (e.g., storage devices, including but not limited to, a memory device, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

Embodiments of the present invention can be implemented in software and/or in a combination of software and hardware, e.g., using application specific integrated circuits (ASIC), a general purpose computer or any other hardware equivalents such as microprocessors. In one embodiment, the present module or process for providing a feedback path to an output signal can be loaded into memory 604 and executed by processor 602 to implement the functions as discussed above. As such, the present module or process 605 for providing a feedback path to an output signal (including associated data structures) of embodiments of the present invention can be stored on a computer readable medium or carrier, e.g., RAM memory, magnetic or optical drive or diskette and the like.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A device, comprising:
   a core module of an integrated circuit for providing one or more output signals;
   an output module for receiving the one or more output signals; and
   an input module, wherein the one or more output signals are received by the input module via one or more feedback paths, where the one or more output signals are forwarded back to the core module, wherein the input module comprises an input multiplexer for receiving a plurality of user inputs, wherein the one or more output signals are also provided to the input multiplexer.

2. The device of claim 1, wherein the integrated circuit is a programmable logic device.

3. The device of claim 1, wherein the one or more output signals comprise at least one of: a 3-state control signal, and an output data signal.

4. The device of claim 1, further comprising:
   an input output block (IOB) pad for receiving at least one of the one or more output signals from the output module.

5. The device of claim 4, wherein the IOB pad is not bonded to a pin.

6. The device of claim 5, wherein the one or more output signals are forwarded back to the core module and rerouted to another IOB pad that is bonded to a pin.

7. The device of claim 4, wherein the one or more feedback paths comprise at least one of: a feedback path connected to an input path of the output module, a feedback path connected to an output path of the output module, and a feedback path connected to an output path of the IOB pad.

8. A method for processing one or more output signals, comprising:
   receiving one or more output signals at an output module from a core module of an integrated circuit;
   receiving the one or more output signals at an input module, wherein the one or more output signals are received by the input module via one or more feedback paths;
   forwarding the one or more output signals back to the core module via the input module; and
   receiving a plurality of user inputs and the one or more output signals at an input multiplexer of the input module.

9. The method of claim 8, wherein the integrated circuit is a programmable logic device.

10. The method of claim 8, wherein the one or more output signals comprise at least one of: a 3-state control signal, and an output data signal.

11. The method of claim 8, further comprising:
    receiving at least one of the one or more output signals by an input output block (IOB) pad from the output module.

12. The method of claim 11, wherein the IOB pad is not bonded to a pin.

13. The method of claim 12, further comprising forwarding the one or more output signals back to the core module and rerouting the one or more output signals to another IOB pad that is bonded to a pin.

14. The method of claim 11, wherein the one or more feedback paths comprise at least one of: a feedback path connected to an input path of the output module, a feedback path connected to an output path of the output module, and a feedback path connected to an output path of the IOB pad.

15. A computer-readable medium having stored thereon a plurality of instructions, the plurality of instructions including instructions which, when executed by a processor, cause the processor to perform steps of a method for processing one or more output signals, comprising:
 receiving one or more output signals at an output module from a core module of an integrated circuit;
 receiving the one or more output signals at an input module, wherein the one or more output signals are received by the input module via one or more feedback paths;
 forwarding the one or more output signals back to the core module via the input module; and
 receiving a plurality of user inputs and the one or more output signals at an input multiplexer of the input module.

16. The computer-readable medium of claim 15, wherein the integrated circuit is a programmable logic device.

17. The computer-readable medium of claim 15, wherein the one or more output signals comprise at least one of: a 3-state control signal, and an output data signal.

18. The computer-readable medium of claim 15, further comprising:
 receiving at least one of the one or more output signals by an input output block (IOB) pad from the output module, wherein the IOB pad is not bonded to a pin.

* * * * *